Dec. 13, 1966 C. R. COOK, JR 3,292,012

LOW OFFSET VOLTAGE LOGIC GATE

Filed May 22, 1964 2 Sheets-Sheet 1

INVENTOR.
Charles R. Cook, Jr.
BY John D. Graham
Attorney

Dec. 13, 1966 C. R. COOK, JR 3,292,012

LOW OFFSET VOLTAGE LOGIC GATE

Filed May 22, 1964 2 Sheets-Sheet 2

INVENTOR.
Charles R. Cook, Jr.
BY
John G. Graham
Attorney

United States Patent Office 3,292,012
Patented Dec. 13, 1966

3,292,012

LOW OFFSET VOLTAGE LOGIC GATE

Charles R. Cook, Jr., Lake Park, Fla., assignor to Texas Instruments Incorporated, Dallas, Tex., a corporation of Delaware Filed May 22, 1964, Ser. No. 369,431
4 Claims. (Cl. 307—88.5)

The present invention relates generally to logic circuits, and more particularly, but not by way of limitation, relates to an improved AND gate.

As is well known in the art, a so-called "AND" gate is a circuit which requires that all of a predetermined number of logic states be present at the gate before an output signal is produced. The conventional and most widely used type of AND gate circuit employs diodes. Due to inherent limitations of these diode logic circuits, it is impractical to cascade a series of AND gates without having an inverter amplifier stage between each gate, and it is virtually impossible to cascade the diode AND gates with a fan-out greater than one. These inherent limitations of diode AND gate circuits materially complicate the overall logic circuit system, such as a digital computer, by requiring many additional stages and circuit components.

The present invention is concerned with an AND logic circuit which utilizes transistors in such a manner that the AND gates can be cascaded with a fan-out substantially greater than one so as to perform more complicated logic functions with a more simplified and reliable circuit. Without intending to limit the invention at this point, the novel circuit may be summarily described as comprising a plurality of input transistors the emitters of which are connected through a resistor to a source of potential, the collectors of which are connected to ground, and the bases of which are connected to the several input circuits. The base of an output transistor is connected to the emitters of the input transistors, the emitter is connected to the gate output terminal, and the collector is connected to a source of potential. The current gain of the input and output transistors increases the input impedance of the circuit and decreases the output impedance so that the gate circuits can be effectively cascaded with a fan-out greater than one.

In accordance with an important aspect of the invention, means are provided to insure that the circuit produces no voltage gain in the low voltage state by providing an impedance between the emitters of the input transistors and the base of the output transistors and a means for increasing the current through the impedance when the input voltage is in the low state. More specifically, this means may comprise a second input transistor for each input, the emitter of which is connected to the base of the output transistor, the collector of which is connected to ground, and the base of which is connected to the respective input terminal. Thus when the input terminal is in low voltage state, the second input transistor will be at low impedance value to increase the current through the impedance and insure no voltage gain through the gate circuit.

Therefore, an important object of the present invention is to provide an AND gate having a high input impedance and low output impedance, yet having no voltage gain at low input voltage level, and minimum voltage drop from input to output at high voltage level so that the AND gate can be cascaded with a fan-out greater than one without the assistance of an inverter amplifier stage.

Another object of the invention is to provide a logic circuit of the type described wherein the resistor tolerances required for operation of the circuit are substantially relaxed.

A further object of the present invention is to provide a circuit of the type described which is particularly suited for fabrication in an integrated circuit.

Still another object of the present invention is to provide an AND gate which can be used to make logic circuits and digital computers of less complexity, greater reliability, and lower cost.

Many additional objects and advantages will be evident to those skilled in the art from the following detailed description and drawings, wherein.

Figure 1:
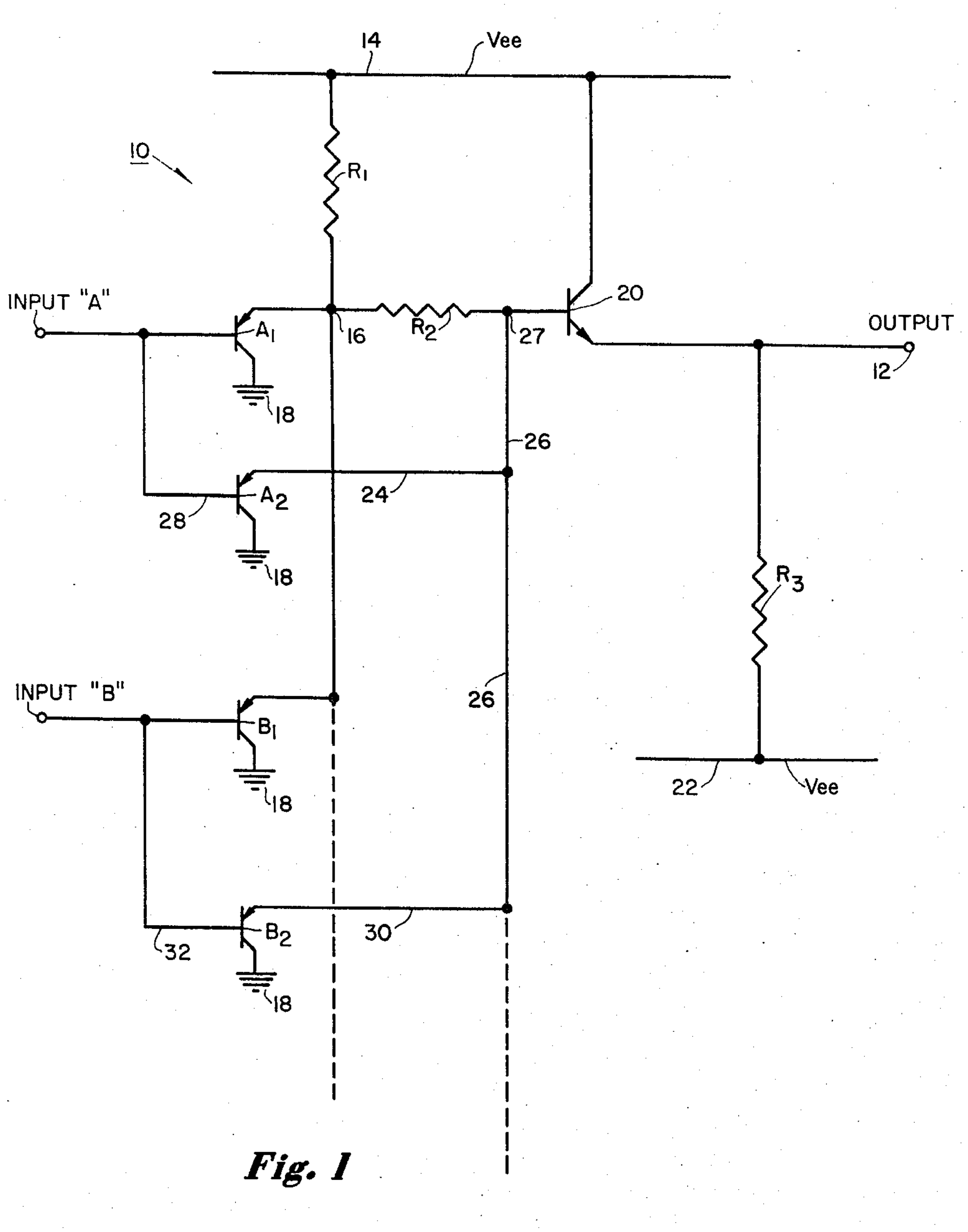
FIGURE 1 is a schematic circuit diagram of a logic gate constructed in accordance with the present invention.

Referring now to the drawings, and in particular to FIGURE 1, a logic circuit constructed in accordance with the present invention is indicated generally by the reference numeral 10. The circuit 10 has any number of input terminals, A, B, etc., and a single output terminal 12. A first resistor $R_1$ is connected between a positive voltage supply 14 and junction 16. The emitter of a first input transistor $A_1$ is connected to the junction 16, the collector is connected to ground, and the base is connected to input terminal A. Thus it will be noted that transistor $A_1$ is connected in common-collector (emitter follower) configuration. A second resistor $R_2$ connects the junction 16 to the base of an output transistor 20. The emitter of the output transistor 20 is connected directly to the output terminal 12 and through resistor $R_3$ to a negative voltage supply, and the collector is connected to the voltage supply 14. Thus the output transistor 20 is connected in common-collector (emitter follower) configuration. The emitter of a second input transistor $A_2$ is connected to junction 27 and therefore to the base of output transistor 20 by conductors 24 and 26 and to the collector supply voltage 14 by resistors $R_2$ and $R_1$. The collector of the second input transistor $A_2$ is connected to ground 18, and the base is connected by conductor 28 to input terminal A.

Thus the transistors $A_1$ and $A_2$ are associated with the same input terminal and for convenience of reference may be considered as the first pair of input transistors. A second pair of input transistors $B_1$ and $B_2$ are connected to junctions 16 and 27 in the same manner as the first pair of input transistors $A_1$ and $A_2$. The emitter of transistor $B_1$ is connected to junction 16, the collector is connected to ground 18, and the base is connected to input terminal B. The emitter of transistor $B_2$ is connected by conductors 30 and 26 to junction 27, the collector is connected to ground 18, and the base is connected to the input terminal by conductor 32. Thus it will be noted that both transistors $B_1$ and $B_2$ are connected in common-collector (emitter follower) configurations. A corresponding pair of input transistors would be provided for each additional input terminal and substantially any number of input terminals may be provided.

Figure 2:
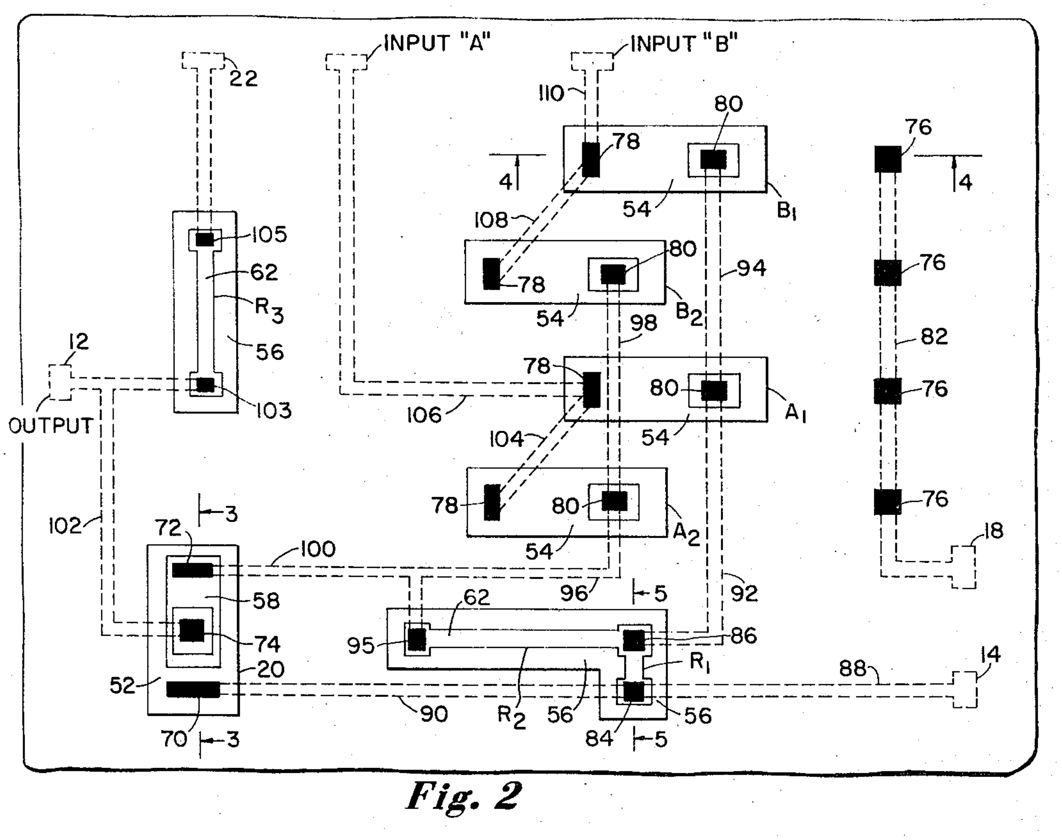
FIGURE 2 is a somewhat schematic plan view of the circuit of FIGURE 1 fabricated in integrate circuit form.
Figure 3:
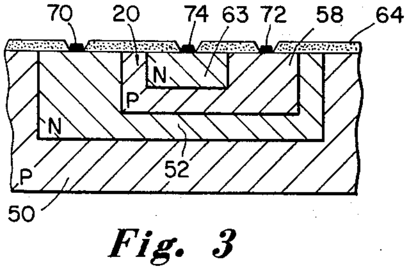
FIGURE 3 is a sectional view taken substantially on lines 3—3 of FIGURE 2.
Figure 4:
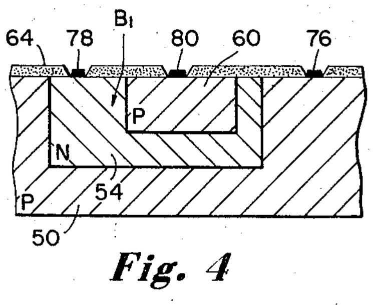
FIGURE 4 is a sectional view taken substantially on lines 4—4 of FIGURE 2.
Figure 5:
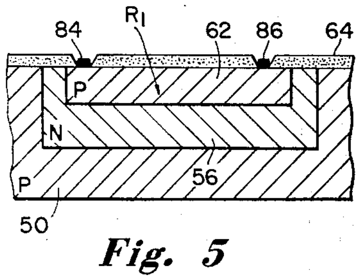
FIGURE 5 is a sectional view taken substantially on lines 5—5 of FIGURE 2.

As previously mentioned, the circuit 10 is particularly adapted for use in integrated circuits fabricated on a single semiconductor crystal using diffusion techniques. For example, the circuit 10 may be constructed on a single-crystal silicon substrate 50 by diffusing the NPN output transistor 20, the PNP input transistors $A_1$, $A_2$, $B_1$ and $B_2$ and the resistors $R_1$, $R_2$ and $R_3$ in the geometries illustrated in FIGURE 2 using essentially a triple-diffusion process. As can best be seen by a comparison of FIGURES 3 and 4, the N-type collector region 52 is of greater depth than the N-type base region 54 of the PNP input transistors $A_1$, $A_2$, $B_1$ and $B_2$ so as to provide the optimum depths of diffusions for both types of transistors. This is accomplished by using a two-stage diffusion wherein only the collector region 52 of the NPN transistor is diffused during the first stage and the collector region 52, the N-type base regions 54 of the PNP transistors $A_1$, $A_2$, $B_1$ and $B_2$ and the isolating N-type regions 56 of the resistors $R_1$, $R_2$ and $R_3$ are all diffused simultaneously. Next the P-type base region 58 of the NPN transistor 20, the P-type emitter regions 60 of the transistors $A_1$, $A_2$, $B_1$ and $B_2$, and the P-type resistor regions 62 of the resistors $R_1$, $R_2$ and $R_3$ are diffused. Then the N-type emitter region 63 of the NPN transistor 20 is diffused.

The above described diffusion may be accomplished using conventional diffusion techniques wherein the silicon oxide film found on the surface of the substrate when the substrate exposed to oxygen is used as a diffusion barrier. Prior to each diffusion the oxide barrier is selectively removed by photographic and etching techniques in the areas to be diffused. After the final diffusion, an oxide barrier film 64 is formed over the entire substrate and serves as electrical insulation. Then the silicon oxide insulating film 64 is again removed in selected areas where it is necessary to make electrical contact with the various regions of the diffused transistor and resistor components. These areas are indicated by the dark areas in FIGURE 2. Next a film of aluminum is vapor-deposited over the entire surface of the substrate 50 and raised to an elevated temperature to alloy the aluminum to the various active regions and insure good electrical contact in the areas where the oxide has been removed. Then the aluminum film is selectively removed by conventional and well-known photographic and etching techniques to leave only the conductors indicated in dotted outline in FIGURE 2. Thus collector, base and emitter terminals 70, 72 and 74, respectively, are formed for the NPN output transistor 20; and collector, base and emitter terminals 76, 78 and 80 are formed for the PNP input transistors $A_1$, $A_2$, $B_1$ and $B_2$. It will be noted from FIGURE 4 that the collector terminals 76 are merely connected to the substrate crystal 50 which forms the common collector for all PNP transistors. However, the collector terminals are located adjacent the respective base regions 54 of the PNP transistors and are interconnected by a vapor-deposited conductor 82 which forms a ground terminal 18 which in turn may be connected to an external ground to improve the operation and reliability of the circuit.

Thus the source of collector voltage 14 is connected by vapor-deposited conductors 88 and 90 to the terminal 84 of resistor $R_1$ and to the collector 70 of the output transistor 20. The terminal 86 of resistor $R_1$ is connected by vapor-deposited conductors 92 and 94 to the emitters 80 of transistors $A_1$ and $B_1$. The terminal 95 of resistor $R_2$ is connected by conductors 96 and 98 to the emitters of transistors $A_2$ and $B_2$. Therefore, the terminal 86 corresponds to the junction 16 of FIGURE 1 and the terminal 95 to the junction 27. Conductor 100 connects the base 72 of the output transistor 20 to the terminal 95 of resistor $R_2$. The emitter 74 of the output transistor 20 is connected by conductor 102 to the output terminal 12 and to the terminal 103 of resistor $R_3$ and the terminal 105 is connected to the emitter supply voltage terminal 22. The base terminals 78 of input transistors $A_1$ and $A_2$ are connected by conductors 104 and 106 to input terminal A. Similarly, the base terminals 78 of input transistors $B_1$ and $B_2$ are connected by conductors 108 and 110 to input terminal B.

OPERATION

It will be noted that all transistors of the logic gate circuit 10 are connected in emitter-follower configuration. Thus when the voltage at input terminal A is at the low level, i.e., logical zero, the emitters of transistors $A_1$ and $A_2$ will also be at substantially the same low level. Similarly, when the voltage at input terminal B is at the low voltage level, the emitters of transistors $B_1$ and $B_2$ will be at a low voltage level. Further, if the voltage at either input terminal A or input terminal B is low, or that at any one of the other input terminals, the junctions 16 and 27 will also be at low voltage even though one or more of the other input terminals is at high voltage because when the bases of the input transistors are at low voltage state, the transistors are at low impedance and the junctions are essentially connected directly to ground. Since the output transistor 20 is also connected in emitter-follower configuration, the emitter of the output transistor and therefore the output terminal 12 will always be at substantially the same voltage level as junction 27. In view of the above, it will be evident that the output terminal 12 will always be at the low voltage level, or zero logic level, except when all input terminals A, B, etc., are at high voltage, i.e., logic level one.

An important advantage of the novel gate circuit 10 is that the input impedance is high and the output impedance is low. This permits a plurality of the gate circuits to be cascaded with a fan-out greater than one without an inverter amplifier stage between the cascaded gate circuits. For example, the output terminal 12 of one AND gate circuit 10 may be connected to one input terminal of one or more AND gate circuits of similar or identical construction and the outputs from each subsequent gate circuit correspondingly connected to a number of additional gate circuits without inverter amplifier stages. The high input impedance is due to the current gain of the input transistors $A_1$, $A_2$, $B_1$ and $B_2$. Thus the requirement for the driver circuit connected to input terminals A and B to dissipate or "sink" current from the bases of the respective input transisters is reduced by a factor corresponding to the current gain of the input transistors as compared to a similar circuit using diodes because a major portion of the current is passed to ground by the input transistors. On the other hand, the output impedance of the circuit 10 is reduced by a factor corresponding to the current gain of the output transistor 20 as compared to a diode circuit because the major portion of the output current need not pass through the resistor $R_1$ as in the case of diode circuits. It will be appreciated that the resistor $R_3$ provides the sink for the base current from the input transistor of the next successive gate circuit when gates are cascaded.

Due to the current gain of the output transistor 20 and the input transistors $A_1$, $A_2$, $B_1$ and $B_2$, the values of the resistors $R_1$ and $R_2$ can vary over a relatively wide range without adversely affecting the operation of the circuit 10 and the level of the output voltage. This facilitates fabricating the circuit 10 as an integrated circuit using conventional diffusion techniques as described above.

A fundamental requirement of any logic circuit is that when the voltage at any input terminal is at the low or logical zero level, the output voltage must not exceed a predetermined minimum level because if the output voltage exceeds the minimum value, the output is not at logical zero level. Thus it is imperative that there be no voltage gain across the AND gate circuit 10 when any one or all input terminals are at the low voltage level. A voltage gain would be possible at low voltage state if the input and output transistors should happen to be mismatched in such a manner that the base-to-emitter voltage of the output transistor 20 were less than the base-to-emitter voltage of any one of the input transistors, except for the operation of the resistor $R_2$ as will presently be described, and the probability of such a mismatch is intolerably high when the circuit is an integrated circuit as described above. For this reason, the resistor $R_2$ is interposed between the emitters of the primary input transistors $A_1$, $B_1$, etc., and the base of the output transistor 20 to provide an IR drop between the input terminal and the output terminal 12 in addition to the base-to-emitter voltage drops across the transistors. However, unless the secondary input transistors $A_2$, $B_2$, etc., are connected as illustrated and described, the current through the resistor $R_2$ at low voltage state would consist only of the base-to-emitter current of the output transistor 20 and would provide only a negligible IR drop. However, since the input voltage is applied to the bases of the secondary input transistors $A_2$ and $B_2$, the secondary input transistors are at low impedance values at low input voltage and a relatively high current is passed through the resistor $R_2$ and from the emitter to the collector of the secondary transistors to significantly increase the IR drop and thereby preclude, as a practical matter, any voltage gain between any input terminal and the output terminal and thereby insure that the voltage at the output at low voltage state will never exceed a predetermined minimum regardless of how many AND gate circuits are cascaded together. For example, if the maximum voltage permitted for logical zero state is 0.3 volt, the circuit 10 would be checked to insure that if 0.3 volt is applied to any one or all of the input terminals A, B, etc., the voltage of the output terminal 12 will not exceed 0.3 volt.

Before a significant number of gate circuits 10 can be cascaded, it is essential that the offset voltage, i.e., the voltage drop from the input terminals to the output terminals at high voltage state, is not excessive. Since a minimum output voltage must be maintained in order to maintain a logical one voltage level, the number of gate circuits which can be cascaded is limited by the offset voltage of each gate circuit and by the total offset voltage across all of the gates which can be tolerated and still maintain the minimum logical one voltage level. The offset voltage of the gate circuit 10 is small in spite of the IR drop of resistor $R_2$ because when the input terminals A, B, etc., are at the high voltage state, the secondary input transistors $A_2$ and $B_2$ are at a high impedance level so that the portion of the current passing through the resistor $R_2$ and through the secondary transistors is reduced to a minimum. Thus the IR drop across the resistor $R_2$ is a result only of the base-to-emitter current of the output transistor 20 and the leakage current of the secondary input transistors $A_2$, $B_2$, etc. The total offset voltage between the input terminals and the output terminal is then essentially equal to the algebraic sum of the IR drop across the resistor $R_2$ and the voltage from base-to-emitter of the input and output transistors. Thus the offset voltage is held to a minimum so that a maximum number of the logic circuit gates can be cascaded together.

From the above detailed description of a preferred embodiment of the present invention, it will be evident that a novel and highly useful logic gate circuit has been described. The logic gate circuit has a high input impedance and a low output impedance which permits a plurality of the gates to be cascaded with a fan-out greater than one without the use of intermediate inverter-amplifier stages. Further, the circuit provides protection against voltage gain at low voltage level, and has a minimum offset voltage at high voltage level. The circuit is particularly adapted for use in integrated circuits of the type fabricated by diffusion techniques on a single crystal substrate because the ranges of resistor values which can be tolerated are substantially increased. The gate circuit also permits a wider variance in the input voltages with which the circuit can be operated.

Although a preferred embodiment of the invention has been described in detail, it is to be understood that various changes, substitutions and alterations can be made therein without departing from the spirit and scope of the invention as defined by the appended claims.

What is claimed is:

1. A logic gate circuit, comprising:

(a) an input transistor of one type, the emitter of which is connected through a first impedance to a voltage supply, the collector of which is connected to ground, and the base of which is connected to an input terminal, (b) an output transistor of the complementary type, the collector of which is connected to said voltage supply, the base of which is connected to the emitter of the said input transistor, and the emitter of which is connected to an output terminal, (c) means for applying a voltage at the said input terminal, (d) a second impedance disposed between the emitter of the said input transistor and the base of the said output transistor for producing an IR drop therebetween, and (e) means for increasing the current through the said second impedance when said voltage at the input terminal is at the low voltage stage, and not appreciably affecting the current through the said second impedance when said voltage at the input terminal is at the high voltage state, whereby the likelihood of voltage gain from said input terminal to said output terminal at the low voltage state is lessened, and the voltage drop from said input terminal to said output terminal is not appreciably changed.

2. A logic gate circuit, comprising:

(a) an input transistor of one type, the emitter of which is connected through a first impedance to a voltage supply, the collector of which is connected to ground, and the base of which is connected to an input terminal, (b) an output transistor of the complementary type, the collector of which is connected to said voltage supply, the base of which is connected to the emitter of the said input transistor, and the emitter of which is connected to an output terminal, (c) means for applying a voltage at the said input terminal, (d) a second impedance disposed between the emitter of the said input transistor and the base of the said output transistor for producing an IR drop therebetween, and (e) a secondary input transistor of said one type, the emitter of which is connected to the base of the said output transistor, the collector of which is connected to ground, and the base of which is connected to the base of the said input transistor, whereby when said voltage at the said input terminal is at the low voltage state, the impedance of said secondary input transistor is at a low value, the current through the said second impedance at a relatively high value, and the IR drop across the said second impedance is at a maximum, thereby preventing voltage gain from said input terminal to said output terminal; and whereby when said voltage at the said input terminal is at the high voltage state, the impedance of the said secondary input transistor is at a high value, the current through the said second impedance at a relatively low value, and the IR drop across said second impedance is at a minimum.

3. A logic gate circuit, comprising:

(a) a plurality of input transistors of one type, the emitters of which are connected throguh a first impedance to a voltage supply, the collectors of which are connected to ground, and the bases of which are each connected to separate input terminals, (b) an output transistor of the complementary type, the collector of which is connected to said voltage supply, the base of which is connected to the emitter of each of the said input transistors, and the emitter of which is connected to an output terminal, (c) means for applying a voltage at each of the said input terminals, (d) a second impedance disposed between the emitters of the said input transistors and the base of the said output transistor for producing an IR drop therebetween, and (e) means for increasing the current through the said second impedance when said voltage at any of the input terminals is at the low voltage state, and not appreciably affecting the current through the said second impedance when said voltage at the input terminals is at the high voltage state, whereby the likelihood of voltage gain from any of said input terminals to said output terminal at the low voltage state is lessened, and the voltage drop from said input terminals to said output terminal is not appreciably changed.

4. A logic gate circuit, comprising:

(a) a plurality of input transistors of one type, the emitters of which are connected through a first impedance to a voltage supply, the collectors of which are connected to ground, and the bases of which are each connected to separate input terminals, (b) an output transistor of the complementary type, the collector of which is connected to said voltage supply, the base of which is connected to an emitter of each of the said input transistors, and the emitter of which is connected to an output terminal, (c) means for applying a voltage at each of the said input terminals, (d) a second impedance disposed between the emitters of the said input transistors and the base of the said output transistor for producing an IR drop therebetween, and (e) a secondary input transistor of said one type for each of said input transistors, the emitters of each secondary input transistor being connected to the base of the said output transistor, the collector of each secondary input transistor being connected to ground, and the base of each secondary input transistor being connected to the base of the corresponding said input transistor, whereby when said voltage at any of the said input terminals is at the low voltage state, the impedance of said corresponding secondary input transistor is at a low value, the current through the said second impedance at a relatively high value, and the IR drop across the said second impedance is at a maximum, thereby preventing voltage gain from each of said input terminals to said output terminal; and whereby when said voltage at the all of the said input terminals is at the high voltage state, the impedance of the said secondary input transistors is at a high value, the current through the said second impedance at a relatively low value, and the IR drop across said second impedance is at a minimum.

References Cited by the Examiner

UNITED STATES PATENTS

| | | | |
|---|---|---|---|
| 3,027,465 | 3/1962 | Di Lorenzo et al. | 307—88.5 |
| 3,050,641 | 8/1962 | Walsh | 307—88.5 |
| 3,073,969 | 1/1963 | Skillen | 307—88.5 |
| 3,205,373 | 9/1965 | Hyman et al. | 307—88.5 |
| 3,209,214 | 9/1965 | Murphy et al. | 307—88.5 X |

ARTHUR GAUSS, *Primary Examiner.*

I. C. EDELL, R. H. EPSTEIN, *Assistant Examiners.*